United States Patent [19]

Smith

[11] Patent Number: 5,206,471

[45] Date of Patent: Apr. 27, 1993

[54] MICROWAVE ACTIVATED GAS GENERATOR

[75] Inventor: Donald K. Smith, Arlington, Mass.

[73] Assignee: Applied Science and Technology, Inc., Woburn, Mass.

[21] Appl. No.: 813,978

[22] Filed: Dec. 26, 1991

[51] Int. Cl.$^5$ .............................. B05C 5/00; H05B 6/64
[52] U.S. Cl. ..................... 219/10.55 R; 219/10.55 A; 219/10.55 F; 315/111.21; 118/620
[58] Field of Search ................ 219/10.55 R, 10.55 M, 219/10.55 A, 10.55 F; 315/111.21, 111.41, 11.51, 111.61; 427/39, 45.1; 118/623, 629, 724, 725; 156/610, 612

[56] References Cited

U.S. PATENT DOCUMENTS

| | | | |
|---|---|---|---|
| 4,207,452 | 6/1980 | Arai | 219/10.55 A |
| 4,805,556 | 2/1989 | Hagan et al. | 118/725 |
| 4,838,990 | 6/1989 | Jucha et al. | 118/725 |
| 4,866,346 | 9/1989 | Gaudreau et al. | 315/111.21 |
| 4,870,030 | 9/1989 | Markunas et al. | 156/610 |
| 4,878,989 | 11/1989 | Purdes | 118/724 |
| 4,908,492 | 3/1990 | Okamoto et al. | 219/10.55 A |
| 4,913,929 | 4/1990 | Moslehi et al. | 118/725 |

Primary Examiner—Bruce A. Reynolds
Assistant Examiner—Tuan Vinh To
Attorney, Agent, or Firm—Iandiorio & Dingman

[57] ABSTRACT

A microwave activated gas generator in which microwave energy is supplied to an activated gas formation region through which a gas to be activated flows in a high-velocity stream. The stream is disturbed within or proximate the activation region to form a downstream stagnation region within the activated gas formation region to encourage microwave gas activation for efficiently coupling power to the gas to form a high-volume, high-velocity activated gas stream.

26 Claims, 4 Drawing Sheets

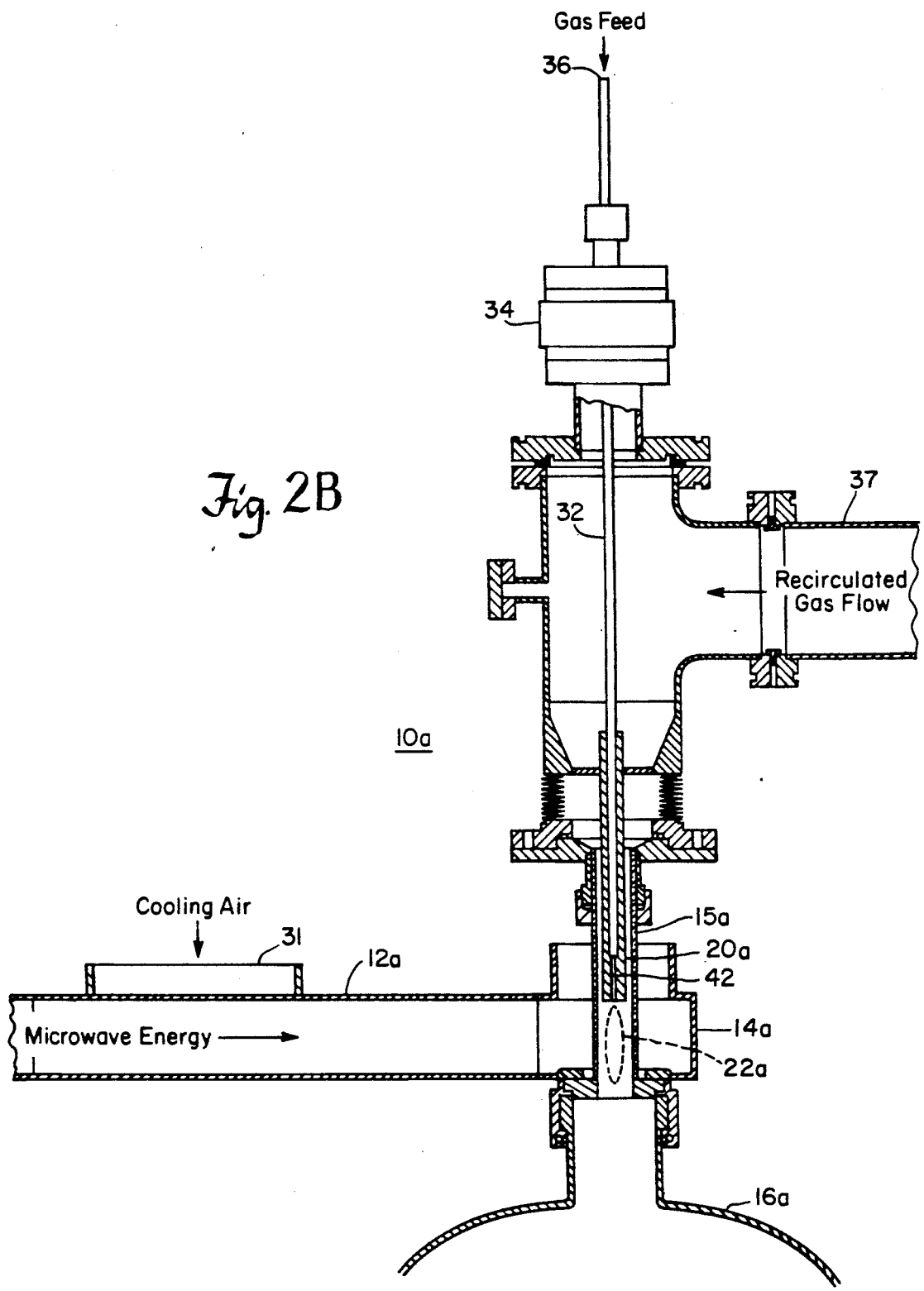

MICROWAVE ACTIVATED GAS GENERATOR

FIELD OF INVENTION

This invention relates to a microwave activated gas generator that efficiently couples power to the gas being activated to create a high volume activated gas stream for downstream processing use.

BACKGROUND OF INVENTION

There are a variety of chemical vapor deposition (CVD) and etching processes, metallurgical applications and processes for melting high-temperature materials that involve the activation of a gas or gas mixture, and transport of the activated gas to a downstream region in which the plasma is employed to either react and condense to form a film of material on a substrate, react to etch the substrate material and many other uses. The gas may be activated by a number of means such as a hot filament, a microwave discharge, a DC discharge, and plasma jets or torches. In each of these processes, energy is transferred to the gas to create an activated gas containing ions, atoms, radicals, molecules, and/or electrons, many of which may be in excited states.

It is important that the desired activated species remain active until they reach the substrate in the downstream processing area. In microwave reactive gas generators, the gas is typically energized while passing through a microwave waveguide. The substrate to be processed is placed just downstream of the waveguide so that the species are in the useful activated state when they impinge on the substrate. The gas is typically either guided through the waveguide in a tube for activated gas downstream applications, or confined within and activated within a vacuum bell jar placed in the waveguide or a resonant chamber coupled to the waveguide.

In the apparatus employing a gas flow tube passing through the waveguide, the amount of energy that can be coupled to the gas is limited by the flow tube heating caused by heat transfer from the activated gas to the tube. Since the flow velocity is reduced at the tube walls, the gas proximate the walls tends to heat more quickly than the gas passing through the center of the tube, and the plasma discharge may even localize near the walls, thereby overheating the flow tube. Accordingly, such downstream microwave activation devices are able to couple only a relatively small amount of power to the flowing gas, making downstream processing rates slow.

In attempts to overcome this problem, there have been proposed systems requiring the use of metal electrodes in contact with the activation region. However, any electrode in close contact with the active gas leads to impurities and inefficiency.

One example of such a microwave gas activation device is disclosed in U.S. Pat. No. 4,767,608, issued on Aug. 30, 1988, to Matsumoto et al. The Matsumoto et al. patent discloses the generation of a plasma using electric discharges and microwaves, in which the plasma is expanded adiabatically to precipitate diamond-like carbon. The conducting electrodes in the plasma formation region lead to contamination of the plasma and so the end product, as well as decreasing the plasma formation efficiency due to the cooling of the gas by heat transfer to the electrodes.

SUMMARY OF INVENTION

It is therefore an object of this invention to provide a microwave activated gas generator that accomplishes fast, economical downstream substrate etching and/or deposition.

It is a further object of this invention to provide such a generator that does not require large volumes of expensive feed gases.

It is a further object of this invention to provide such a generator that does not require a metal electrode in contact with the activated gas.

It is a further object of this invention to provide such a generator that allows the coupling of increased microwave power without overheating the flow tube.

It is a further object of this invention to provide such a generator that efficiently forms the plasma.

It is a further object of this invention to provide such a generator that accomplishes flow tube cooling in the gas activation region without any external cooling device.

It is a further object of this invention to provide such a generator that maintains the flow tube at a relatively cool temperature without a high gas feed rate.

It is a further object of this invention to provide such a generator that accomplishes etching and deposition at a lower feed gas cost.

This invention results from the realization that microwave energy may be efficiently coupled to gas in a flow tube passing through a microwave waveguide by disturbing the gas flow in the gas activation region to form a downstream gas stagnation region that encourages microwave gas activation in the region, and allowing gas to flow at a higher rate around the stagnation region proximate the tube walls to keep the tube walls cool.

This invention may consist essentially of a microwave activated gas generator that includes means for supplying microwave energy to an activated gas formation region, means for flowing a gas to be activated in a high-velocity stream through the activated gas formation region, and means for disturbing the flowing gas stream to form a downstream stagnation region in the activated gas formation region for encouraging microwave gas activation in the gas formation region to effectively couple power to the gas for forming a high-volume, high-velocity activated gas stream. Preferably, the flowing gas stream is disturbed with one or more objects placed in the gas stream. The object may be made from a dielectric material such as quartz, or boron nitride, and may be centered within the gas flow tube. If the tube has a round cross section, the object may be cylindrical. Additionally, the object may have an axial or lengthwise opening that allows a feed gas to be fed through the object and directly into the stagnation region just downstream of the object to allow efficient coupling of energy directly to the gas as its fed into the system. The flowing gas may be provided by a recirculation pumping system.

The microwave energy may be supplied with a waveguide that carries energy from the microwave source to the flowing gas. In that case, the activated gas formation region is within the waveguide.

In one embodiment, the gas is recirculated through the activated gas formation region at a velocity of at least 1,000 centimeters per minute. The pressure within the system is preferably maintained from the millitorr level up to about 100 torr. A plurality of plasma flow streams may be provided by employing more than one object placed within one or more flow streams to provide a desired number of stagnation regions to which the microwave power is coupled.

DISCLOSURE OF PREFERRED EMBODIMENT

Other objects, features and advantages will occur to those skilled in the art from the following description of a preferred embodiment and the accompanying drawings, in which:

FIG. 2B is an enlarged, partly cross-sectional view of part of the apparatus of FIG. 2A detailing the gas feed, the stagnation region, and the gas feed into the stagnation region;

Figure 1:
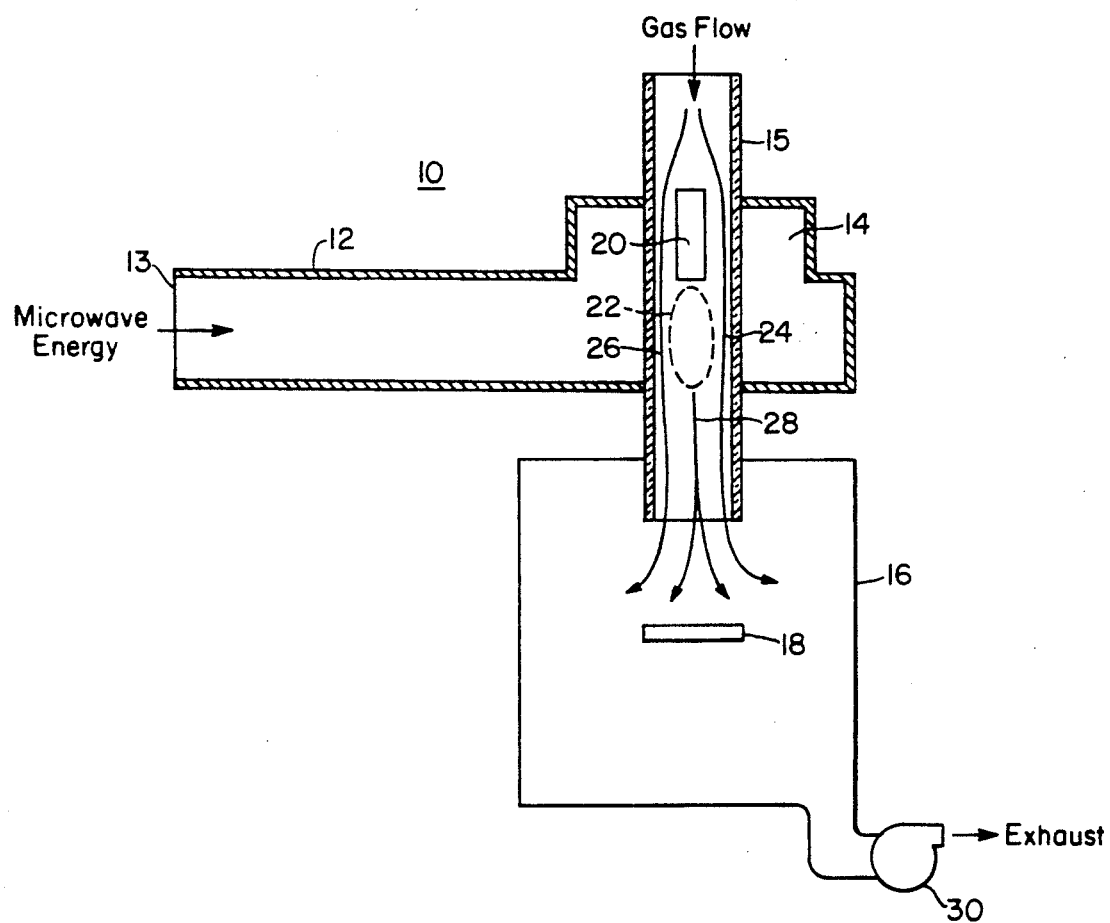
FIG. 1 is a schematic diagram of a microwave activated gas generator according to this invention.

There is shown in FIG. 1 microwave activated gas generator 10 according to this invention including microwave waveguide 12 having one end 13 for accepting microwave energy and another end 14 comprising a chamber. Gas flow tube 15 passes transversely through chamber 14 for exposing the gas to be activated to the microwave energy in the waveguide, and then supplying the activated gas to downstream processing chamber 16, which has substrate 18 therein for processing by the activated gas. Operations such as deposition, etching, melting of materials and metallurgical processes may be performed with the activated gas. Exhaust pump 30 is employed in combination with gas flow control means such as a valve to maintain a desired operating pressure, typically at the millitorr level and up to 100 torr, for example, in processing chamber 16.

Object 20, which is preferably a piece of dielectric material such as quartz, or boron nitride, is placed in quartz flow tube 15 at least partially upstream of the desired gas activation region to disturb the flow downstream and thereby create a stagnation or eddy region 22 within the portion of the flow tube in which the microwave energy is coupled to the gas. Object 20 also creates a higher flow gas stream passing by region 22 proximate the walls of tube 15 as shown by gas flow lines 24 and 26. Stagnation region 22 encourages coupling of the microwave energy to the gas in that region as opposed to in the higher velocity flow regions 24 and 26 proximate the tube walls to accomplish most of the energy transfer towards the center of tube 15 to keep the tube cool. In combination with an increased flow velocity proximate the tube walls, the stagnation region allows the coupling of higher levels of microwave energy to the gas while maintaining an operating temperature at the walls below that which would cause the walls of tube 15 to soften or melt.

The stagnation region consists of a vortex and/or turbulence which confines gas molecules to the region of the vortex or turbulent wake for longer periods of time than would otherwise occur in the free flowing stream, allowing higher steady state temperature to be reached in this region, thereby sustaining the plasma discharge in the stagnation region. Additionally, there is no heat sink in the stagnation region leading to much more efficient use of energy than would occur for a plasma formed in contact with the wall of the tube. The result of this more efficient coupling of microwave energy is the formation of large volumes of activated gas to accomplish downstream processing at a higher rate.

Figure 2A:
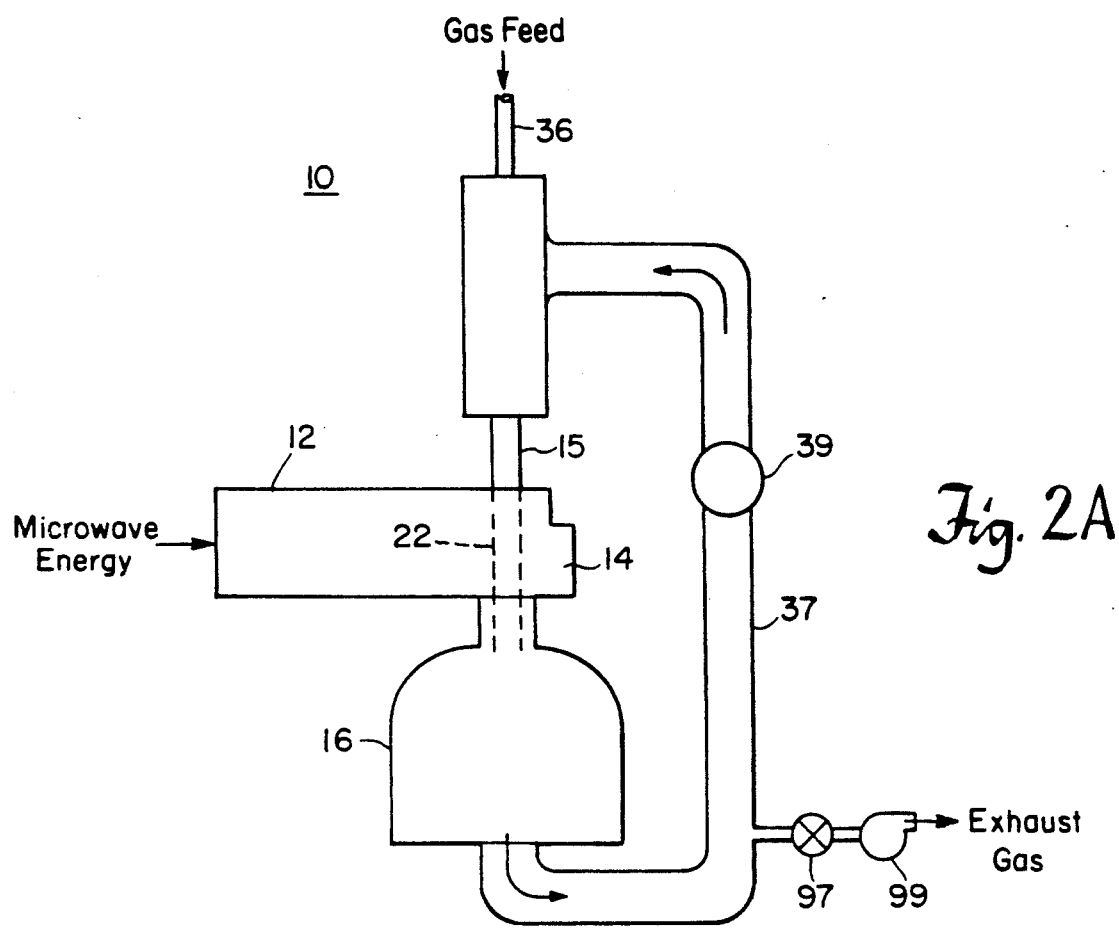
FIG. 2A is a schematic diagram of another embodiment of the microwave activated gas generator according to this invention with high-velocity feed gas recirculation.

FIG. 2A details one means of supplying the high volume of activated gas quickly from the gas activation region in waveguide 12 to downstream processing area 16. In this embodiment, high volume, low pressure, recirculation pump 39 is employed to continuously recirculate gas from processing chamber 16 through activation region 22 in waveguide 14. Gas feed through tube 36 is provided upstream of or in the gas activation region as shown with more particularity in conjunction with FIG. 2B. In conjunction with the gas feed, exhaust pump 99 and flow control valve 97 are employed to maintain a desired operating pressure and gas composition. Preferably, recirculator 39 operates at approximately 1,000 cubic meters per hour to create a gas velocity within flow tube 15 in the range of 1,000 to 100,000 centimeters per second at a pressure of 50 torr in a 25 mm flow tube: pumps that have been found useful for such recirculation conditions are the model 1000L Turbostream and model WSL 1001 blowers manufactured by Leybold-Heraeus GmbH of West Germany. The operating pressure within the system is preferably maintained at 10 to 100 torr, although the system may operate at any pressure, including atmospheric or sub-atmospheric pressure down to the millitorr level.

The creation of the stagnation region within the activated gas formation region and the means of adding the feed gas of FIG. 2A is shown in more detail in FIG. 2B. Gas feed tube 36 communicates with the hollow interior of cylindrical dielectric body 42 that is placed in the center of flow tube 15a to form stagnation region 22a, also centered in the tube, and within the gas activation region for allowing efficient coupling of high levels of microwave power in the tube. Device 34 provides for axial displacement of tube 32 and so body 20a, so that body 20a may be positioned where desired along the length of flow control tube 15a for providing downstream gas stagnation region 22a where desired. If flow-tube cooling air is desired, to allow even higher levels of energy to be coupled to the gas, cooling air port 31 may be provided.

Figure 3:
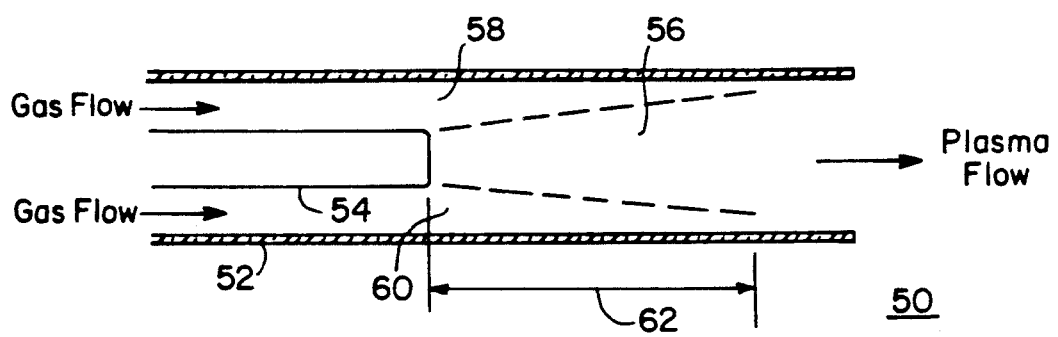
FIG. 3 is an enlarged cross-sectional schematic diagram of one means of disturbing the flowing gas stream to form a stagnation region for the generator of this invention.

FIG. 3 shows in greater detail a preferred means of creating the gas flow stagnation region that encourages gas activation. In FIG. 3, dielectric bluff body 54 that is preferably cylindrical and centered within tube 52 is used to disturb gas flow in region 56, while at the same time increasing the gas flow velocity near the tube wall surrounding region 56, in regions 60 and 58, to keep the tube walls cool along length 62 of activation region 56 so that high levels of power can be coupled to the gas. As an example of the dramatic increase in the power-handling capability of the system according to this invention, it was found that an apparatus as shown in FIG. 3 except having no bluff body could not sustain a plasma discharge other than at localized spots in contact with the wall of the tube at any level of microwave power, even below 1 kw. In contrast, an identical apparatus with the bluff body sustains a discharge in the center of the tube without contact with the wall for microwave power greater than 4 kw and gas flow velocity in the 50–500 m$^3$/h range.

Figure 6:
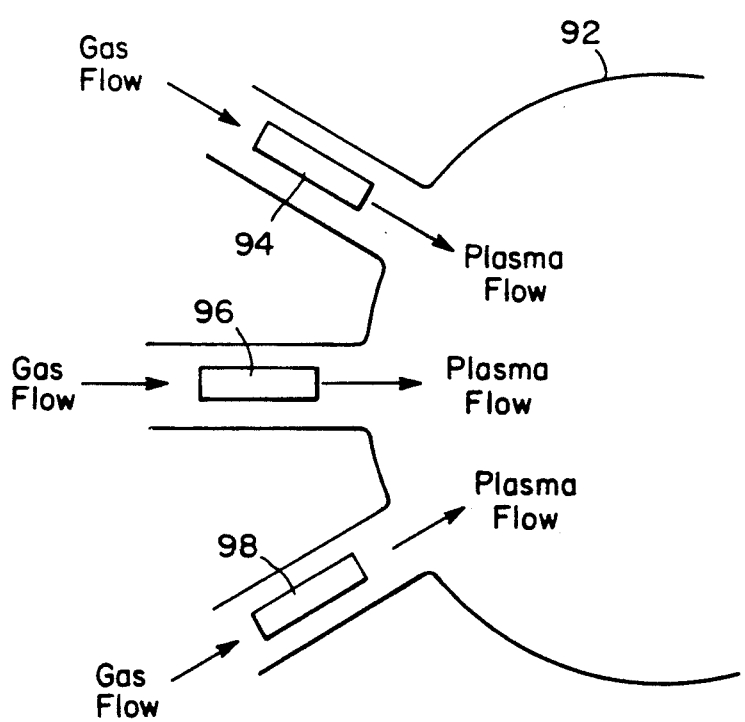
FIG. 6 is an application of the principle of FIG. 5 showing one means of employing multiple stagnation regions for supplying multiple plasma streams to a downstream processing area.
Figure 4:
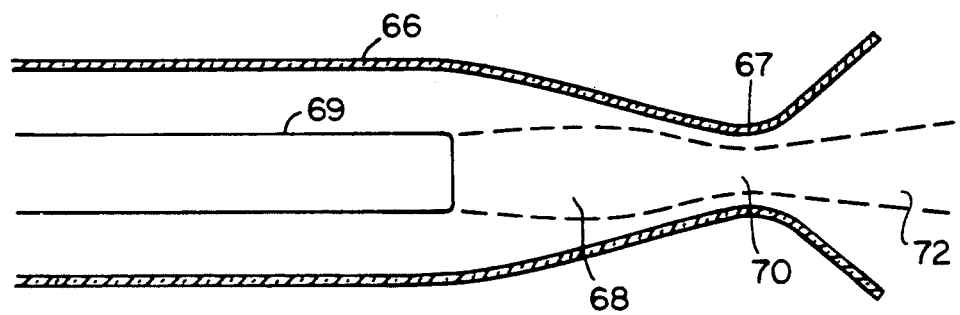
FIG. 4 is an alternative to FIG. 3 showing a means of controlling the shape of the stagnation region to control the shape and velocity of the activated gas stream.
Figure 5:
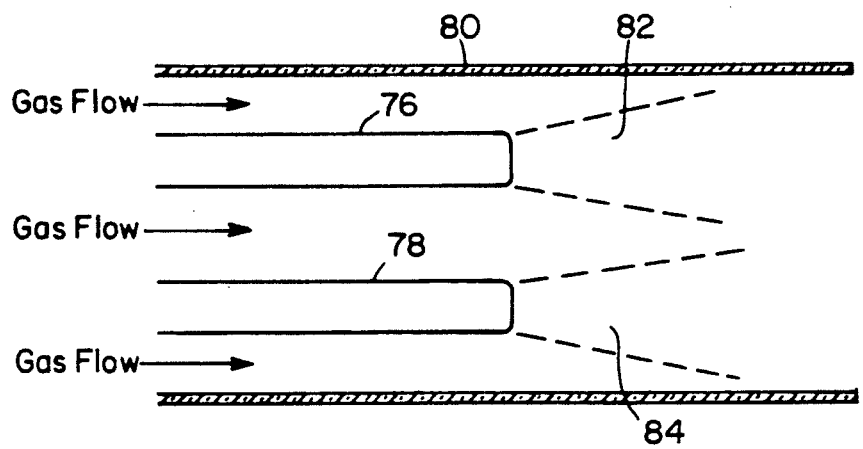
FIG. 5 is another alternative to FIG. 3 showing the creation of multiple stagnation regions.

Alternative arrangements of the bluff body and the stagnation region created thereby are shown in FIGS. 4 through 6. In FIG. 4, bluff body 69 is again centered within tube 66 to create a stagnation region comprising area 68 just downstream of bluff body 69 and reduced area region 70 which is accomplished by reducing the cross section of tube 66 in region 67 to tailor the plasma flow stream as desired. Further tailoring may be accomplished, for example, as shown in FIG. 5 by using more than one bluff body to provide more than one stagnation region to which energy is coupled, to provide more than one plasma flow stream. In the example of FIG. 5, bluff bodies 76 and 78 are both placed within flow tube 80 to provide plasma flow streams 82 and 84, respectively. FIG. 6 shows another application of this concept in which bluff bodies 94, 96 and 98 are provided in three separate gas flow tubes to provide three plasma flow streams to processing chamber 92 to accomplish a desired downstream objective.

Although specific features of the invention are shown in some drawings and not others, this is for convenience only as each feature may be combined with any or all of the other features in accordance with the invention.

Other embodiments will occur to those skilled in the art and are within the following claims:

What is claimed is:

1. A microwave activated gas generator, comprising:
    means for supplying microwave energy to an activated gas formation region;
    means for flowing gas to be activated through said activated gas formation region; and
    means for disturbing the flowing gas stream to form a downstream stagnation region in said activated gas formation region for encouraging microwave gas activation to effectively couple power to the gas for forming a relatively high volume of activated gas in the gas stream.

2. The microwave activated gas generator of claim 1 in which said means for disturbing includes an object in the flowing gas stream.

3. The microwave activated gas generator of claim 2 in which said object is made from a dielectric material.

4. The microwave activated gas generator of claim 2 in which said object is at least partly in the activated gas formation region.

5. The microwave activated gas generator of claim 3 in which said material is quartz.

6. The microwave activated gas generator of claim 3 in which said material is boron nitride.

7. The microwave activated gas generator of claim 1 further including means for recirculating the gas to be activated in a high-velocity stream through said activated gas formation region.

8. The microwave activated gas generator of claim 7 in which said means for recirculating includes a gas confining conduit passing through the activated gas formation region.

9. The microwave activated gas generator of claim 7 in which said gas is recirculated through the activated gas formation region at a velocity of at least 1000 cm/min.

10. The microwave activated gas generator of claim 8 in which said means for disturbing includes an object in said conduit.

11. The microwave activated gas generator of claim 8 in which said conduit is a tube.

12. The microwave activated gas generator of claim 8 in which said conduit is made of a dielectric material.

13. The microwave activated gas generator of claim 12 in which said material is quartz.

14. The microwave activated gas generator of claim 10 in which said object is spaced from the walls of said conduit for allowing the gas to pass by said object for cooling the conduit walls.

15. The microwave activated gas generator of claim 10 in which said means for recirculating includes means for introducing a gas directly into said gas formation region through said object.

16. The microwave activated gas generator of claim 1 further including means for providing in said activated gas formation region a gas pressure of up to 100 torr.

17. The microwave activated gas generator of claim 1 in which said means for disturbing includes a plurality of spaced objects in the stream for forming a plurality of disturbed flow regions.

18. The microwave activated gas generator of claim 1 in which said means for supplying microwave energy includes a waveguide for carrying microwave energy from a microwave source to the flowing gas.

19. The microwave activated gas generator of claim 18 in which the activated gas formation region is in said waveguide.

20. A microwave activated gas generator, comprising:
    a microwave waveguide adapted at one end to receive microwave energy and having an activation region for coupling the energy to a gas to be activated;
    a gas flow tube passing transversely through said activation region for carrying a gas to be activated into and through said region at high velocity; and
    an object placed in said tube to disturb the flow in said activation region for creating a downstream stagnation region to encourage gas activation in the activation region.

21. The microwave activated gas generator of claim 20 in which said object is spaced from the tube walls for allowing the gas to pass by said object for cooling the tube walls downstream of said object.

22. The microwave activated gas generator of claim 21 in which said object is at least partly upstream of said activation region for cooling the tube walls in said region.

23. A microwave activated gas generator, comprising:
    a microwave waveguide adapted at one end to receive microwave energy and having an activation region for coupling the energy to a gas to be activated;
    a gas flow tube passing transversely through said activation region for carrying a gas to be activated;
    means for recirculating gas through the activation region in said gas flow tube at high velocity; and
    an object in said tube and spaced from the tube walls at least partly upstream of said activation region for disturbing the flow in the center of said tube in said activation region to encourage activation in the disturbed flow region for cooling the tube walls to allow more energy to be coupled to the gas for more efficient activated gas formation.

24. The microwave activated gas generator of claim 23 in which said object has a hollow core for allowing gas feed through said object directly into the disturbed gas flow region.

25. A microwave activated high velocity gas generator comprising:

an activated gas formation region;

means for supplying microwave energy to said formation region;

means for introducing a flow of gas into said formation region;

a processing area spaced from said formation region for utilizing the activated gas;

means for disturbing the flow of gas in said formation region to form a downstream stagnation region in said formation region to encourage gas activation in the formation region; and a high velocity pump for moving activated gas to said processing area by convection while the remains activated.

26. The microwave activated gas generator of claim 25 in which said means for disturbing the flow of gas includes an object placed in the flowing gas stream.

* * * * *